United States Patent [19]

Farrugia

[11] Patent Number: 4,849,942
[45] Date of Patent: Jul. 18, 1989

[54] PROTECTION DEVICE FOR AN ERASABLE AND REPROGRAMMABLE READ ONLY MEMORY

[75] Inventor: Augustin Farrugia, La Ciotat, France

[73] Assignee: SGS Thomson Microelectronics S.A., Gentilly, France

[21] Appl. No.: 133,738

[22] Filed: Dec. 16, 1987

[30] Foreign Application Priority Data

Dec. 19, 1986 [FR] France ................ 86 17887

[51] Int. Cl.$^4$ ............................................. G11C 13/00
[52] U.S. Cl. ................................ 365/228; 365/189.04; 365/230.01
[58] Field of Search ................ 365/182, 189, 228, 230

[56] References Cited

FOREIGN PATENT DOCUMENTS 0142983 5/1985 European Pat. Off. .
2471004 12/1981 France .

Primary Examiner—Terrell W. Fears
Attorney, Agent, or Firm—Oblon, Spivak, McClelland, Maier & Neustadt

[57] ABSTRACT

A protection device which detects an erasable and programmable ROM is disclosed. The device includes a memory cell and a means for writing and reading the cell as used to program the cell to a given state. The programming of the cell prevents any reprogramming of the memory unless a previous erasure of the cell has occurred.

5 Claims, 1 Drawing Sheet

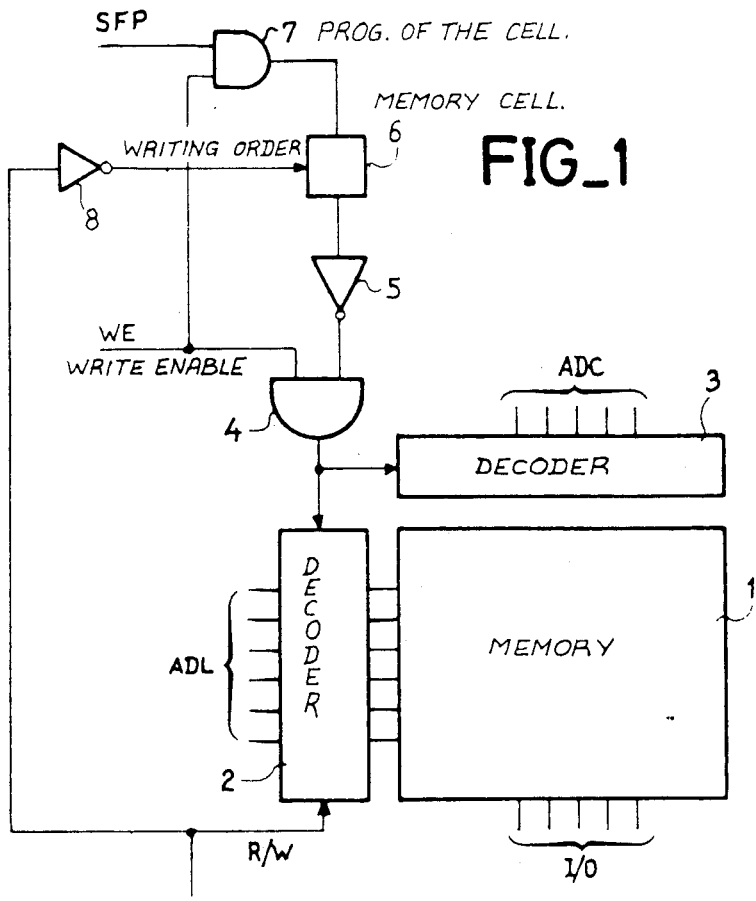
FIG_1

PROTECTION DEVICE FOR AN ERASABLE AND REPROGRAMMABLE READ ONLY MEMORY

BACKGROUND OF THE INVENTION

The present invention relates to protection devices for erasable and reprogrammable read only memories for integrated circuits.

The first type of erasable and reprogrammbale ROM is known as EPROM memory. It is a non volatile memory whose contents may be erased by exposure to ultraviolet radiation. Without voluntary erasure of the contents of such a memory, it is always possible to write on top of a first program, but that generally results in superimposing two programs, that is to say in short in losing the information.

The second type of erasable and reprogrammable ROM is known as EEPROM memory. In this case they are non volatile memories whose contents may be erased electrically, that is to say by applying predetermined voltage levels. In this case as well it is always possible to reprogram on top of the first program, but that also results in losing the information.

When such memories have been programmed, it is not possible to know if they are effectively programmed without reading their contents.

Now, for reading the contents of a memory, it must be connected to a reading circuit. This operation is tedious but necessary if, when programming a memory, it is not desired to superimpose two programs which would consequently lead to information no longer having any meaning or to a loss of the first information stored.

It is known to protect EPROM and EEPROM memories against any falsification of their contents by making them unusable. For that, a tell tale bit is programmed into the memory, at the end of programming thereof. Thus, when the memory is deprogrammed, voluntarily, or involuntarily, the tell tale bit is also deprogrammed. Since this tell tale bit is used for addressing during reading, reading of the memory is blocked. The presence of the tell tale bit therefore prevents the use of the memory only when it has been partially erased or reprogrammed. Such a protection is not suitable for solving the problem which is raised, since it is a question of preventing undesired reprogramming.

SUMMARY OF THE INVENTION

To overcome this problem, the present invention provides a detection device for an erasable and reprogrammable ROM including a memory cell and means for writing into and reading from the cell for programming this cell to a given state, programming of this cell inhibiting any signal for writing data into the memory so as to prevent any reprogramming of the memory previously erasing the program of the cell.

BRIEF DESCRIPTION OF THE DRAWINGS

Other features and advantages of the present invention will be clear from reading the following description given by way of non limitative example with reference to the accompanying FIG. which shows:

A diagram of the construction of a device of the invention corresponding to a preferred embodiment.

DESCRIPTION OF THE PREFERRED EMBODIMENT

The memory shown in the single FIG. corresponds to a non volatile ROM erasable either electrically or by ultraviolet radiation.

This memory is programmed in a conventional way, that is to say by application of given voltage levels on each line and on each column so that the logic state of each memory point formed by an MOS type transistor connected to a line and a column is modified or not.

The memory is programmed through line 2 and column 3 decoders. These decoders make it possible respectively to decode the line addresses ADL and the column addresses ADC and to read data O or to write data I depending on the state of the reading-writing signal R/W. Writing takes place after reception of an enable signal WE.

In the device of the invention, the writing enable signal WE is not directly applied to the line-column decoders. This signal is appiled to the input of an AND gate 4. The AND gate 4 receives at another input and output signal from an inverting gate 5. The inverting gate 5 receives the signal corresponding to a logic state "0" or "1" of the memory signal 6 dependng on whether this cell has been programmed or not. The memory cell 6 is programmed on the reception of an end of programming order SFP for memory 1 and a writing enable WE. The corresponding signals SFP and WE are applied respectively to the inputs of an AND gate 7. The two conditions for programming the cell 6 are present when these signals are in state 1 so that the output of gate 7 makes it possible, when an order W is given for writing into cell 6, to program this cell in the desired state.

As long as the end of programming signal SFP is not applied, that is to say as long as the signal is in state O, memory 1 is programmable. When the user finishes programming this memory, he causes the emission of the signal SFP whose logic state represents the end of programming and the logic state of the writing enable signal WE is maintained so as to be able to write into cell 6, these two signals are received at the input of the AND gate 7. The output logic level of this gate then makes it possible to program the memory cell 6 either for example by causing it to pass from a logic state 0 to a logic state 1, a writing order having of course been given. To obtain the writing-reading order, the R/W order of memory 1 is used, inverted by a gate 8.

During the first programming of memory 1, the R/W signal is for example at 1, which corresponds to a writing order for memory 1 and to a reading order for cell 6. The writing enable signal WE is at state 1. The contents of cell 6 is read, the logic state of this content is for example 0, the output of gate 5 is at 1. The output of gate 4 is at 1, memory 1 is programmable.

At the end of programmable memory 1, the signal SFP is at 1, the signal W is at 1, the signal R/W is at 0 which corresponds to a writing order for cell 6. The programming logic state of the cell is for example 1. The output of gate 5 is a 0. Gate 4 prevents any writing enable.

During any attempt at writing into memory 1, after cell 6 has been programmed, the contents of this cell is systematically read, which prevents any reprogramming. In fact, the AND gate 4, which receives at one of its inputs the signal representing the logic state of the memory cell 6, will, whatever the logic state of the signal WE for enabling writing into memory 1, prevent any reprogramming thereof. Memory 1 is therefore protected against reprogramming, i.e. by a user who did not know that this memory was programmed. It is of course always possible to reprogram such a memory in the case of an EPROM memory, for example, by providing a window which lets ultraviolet radiation pass over all the memory cells including the protection cell 6 for this memory 1.

So as to make possible reading and writing of cell 6 which includes a floating gate transistor, gates 7 and 8 are chosen so that they deliver a low level at 5V or a high level at 12V.

What is claimed is:

1. A protection device for a programmable non-volatile memory array, comprising:

a non-volatile memory cell;

means for reading the state of said cell during a desired writing operation in said memory array;

means for inhibiting writing in said memory array when said state read in said cell is a first given state; and means for writing said first state in said cell at the end of an operation wherein the entirety of said array is programmed.

2. A protection device according to claim 1, wherein said cell is provided with a reading output wherein said reading output is connected to a first input of a gate and wherein said gate has a second input for receiving a write enable signal in order to allow a writing operation of said memory array and wherein said gate inhibits transmission of said write enable signal when said cell is read in said first state.

3. A protection device according to claim 1, wherein said cell includes a means for receiving a read/write control signal which is the logical compliment of a read/write signal of said memory array so that said cell is read whenever said memory array is to be written.

4. A protection device according to claim 2, wherein said cell includes a means for receiving a read/write control signal which is the logical compliment of a read/write signal of said memory array so that said cell is read whenever said memory array is to be written.

5. A protection device according to claim 1, wherein said cell is controlled by a gate having a first input for receiving a write enable signal and a second input for receiving an end control signal and wherein said gate supplies a program order upon reception of both said write enable signal and said end control signal and further including a means for supplying said end control signal at the end of a writing operation.

* * * * *